United States Patent [19]

Takechi et al.

[11] Patent Number: 5,068,169

[45] Date of Patent: Nov. 26, 1991

[54] PROCESS FOR PRODUCTION OF SEMICONDUCTOR DEVICE

[75] Inventors: Satoshi Takechi, Machida; Yuko Nakamura, Kawasaki; Yukari Mihara, Yokohami, all of Japan

[73] Assignee: Fujitsu Limited, Kawqasaki, Japan

[21] Appl. No.: 426,755

[22] Filed: Oct. 26, 1989

[30] Foreign Application Priority Data

Oct. 26, 1988 [JP] Japan .................. 63-268298

[51] Int. Cl.$^5$ ............................... G03F 7/36
[52] U.S. Cl. .................... 430/313; 430/317; 430/323; 430/326; 156/643
[58] Field of Search ............ 430/313, 317, 323, 326; 156/643

[56] References Cited

U.S. PATENT DOCUMENTS

| | | | |
|---|---|---|---|
| 4,481,049 | 11/1984 | Reichmanis et al. | 430/313 X |
| 4,551,417 | 11/1985 | Suzuki et al. | 430/313 X |
| 4,665,006 | 6/1987 | Sachdev et al. | 430/313 X |
| 4,770,977 | 9/1988 | Buiguez et al. | 430/323 |

FOREIGN PATENT DOCUMENTS 0178208 4/1986 European Pat. Off. .
3628046 2/1987 Fed. Rep. of Germany .

OTHER PUBLICATIONS

F. Buiguez et al., "A New Positive Optical Resist for BiLayer Resist Systems", Microcircuits Engineering Conference in Berlin, 1984, 12 pages.

Primary Examiner—Cynthia Hamilton
Attorney, Agent, or Firm—Staas & Halsey

[57] ABSTRACT

Disclosed is a process for the production of a semiconductor device, which comprises forming a film of a resist composed of a substance generating an acid catalyst by being irradiated with radiation and a polymer having an Si-containing group that can be eliminated by the acid catalyst, irradiating the resist film with radiations and patterning the irradiated resist film by oxygen reactive ion etching, ECR etching or reactive ion beam etching. This process is advantageously used for preparing a semiconductor device by the two-layer resist method.

4 Claims, 2 Drawing Sheets

PROCESS FOR PRODUCTION OF SEMICONDUCTOR DEVICE

BACKGROUND OF THE INVENTION

1. Field of the Invention

The present invention relates to a process for the production of a semiconductor device, which comprises forming a film of a radiation-sensitive polymer and patterning the formed film.

2. Description of the Related Art

In the production of integrated circuits, an increase of the density and integration degree of elements is urgently required, and the development and establishment of ultrafine processing techniques of circuit patterns are progressing rapidly. In lithographic processes, methods of forming patterns by using high-energy radiation having a short wavelength, such as far ultraviolet rays, X-rays, and electron beams, instead of the ultraviolet rays heretofore used, have been developed, and with this development, the establishment of a technique of providing a high-performance resist material sensitive to these radiations is indispensable. In the production of integrated circuits, a method is adopted in which a resist material is coated on a substrate, exposed and developed to form a fine pattern, and using the obtained pattern as a mask, the substrate is etched. In this production method, the resist must have a high sensitivity and a high resolution such that a fine pattern on the submicron order can be obtained. Further, for the etching method, the wet etching method giving a large side etching has been replaced by the dry etching method. Accordingly, the resist must have a dry etching resistance. Very few resists, however, satisfy all of these requirements.

As the means for solving the problem of the dry etching resistance and the problem of the deviation of the resolution owing to the dispersion of the resist thickness caused by the uneven surface of the substrate, a two-layer resist method is adopted which comprises forming a thick planarizing layer of an organic material on the substrate and coating a resist material thinly on the planarizing layer to obtain a high sensitivity and a high resolution.

In the two-layer resist method, a polymer containing Si is used for the top layer, patterning is performed by light exposure and development of the top layer, and the bottom layer is etched by using the top layer as the mask by an oxygen reactive ion etching ($O_2RIE$) to form a pattern. In this method, however, the steps are more complicated than in the single-layer resist method, and a reduction of the yield and throughput occurs. Accordingly, a simplification of the steps is desired.

The catalytic decomposition of trimethylsilyl poly(vinylphenol) in the presence of photo acid generator is disclosed in Microelectronic Engineering, 6 (1987), pages 393–398 (North-Holland), but the dry-etching process for this resist composition is not disclosed.

A process using a polymer containing organosilicon monomers as the X-ray resist and dry-developing this resist with $O_2$ plasma is disclosed in J. Vac. Sci. Technol., 19, No. 4, pages 872–880 (1981). In this process, the organosilicon monomers are fixed to the light-exposed area to act as the mask for oxygen reactive ion etching, and a negative resist pattern is formed.

SUMMARY OF THE INVENTION

A primary object of the present invention is to provide a process in which, by carrying out a dry development after exposure to radiation, a positive resist pattern is formed. According to this process, the steps are simplified, especially in the above-mentioned two-layer resist method, and the yield and throughput can be increased.

In accordance with the present invention, this object can be attained by a process for the production of a semiconductor device, which comprises forming a film of a resist composed of a substance generating an acid catalyst by being irradiated with radiation and a polymer having an Si-containing group that can be eliminated by the acid catalyst, selectively irradiating the resist film with radiation, and patterning the irradiated resist film by oxygen reactive ion etching, ECR etching or reactive ion beam etching.

Furthermore, in accordance with the present invention, there is provided a process for the production of a semiconductor device according to the two-layer resist method, which comprises forming a planarizing layer composed of an organic material on a substrate, forming a film of a polymer on the planarizing layer and forming a pattern, wherein light exposure is carried out by using a resist composed of a substance generating an acid catalyst by being irradiated with radiation and a polymer having an Si-containing group that can be eliminated by the acid catalyst, as said polymer, and the top layer and the bottom layer are simultaneously patterned by oxygen reactive ion etching, ECR etching or reactive ion beam etching.

DESCRIPTION OF THE PREFERRED EMBODIMENTS

Polymers having on the side chain a structure represented by the following structural formula (1) or (2) are preferable as the resist polymer valuably used in the present invention:

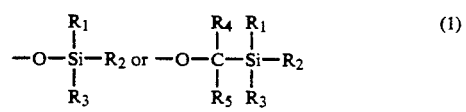

or

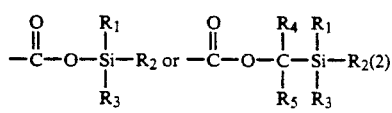

wherein $R_1$, $R_2$ and $R_3$ each represent an alkyl group or a phenyl group, and $R_4$ and $R_5$ each represent a hydrogen atom, an alkyl group, a phenyl group or

As the polymer having the above-mentioned side chain, there can be mentioned, for example, homopolymer and copolymers of phenol-novolak, hydroxystyrene, a derivative thereof, an α-substituted hydroxystyrene, a derivative thereof, acrylic acid, an ester thereof, an α-substituted acrylic acid, an ester thereof, itaconic acid, an ester thereof, carboxystyrene, a derivative thereof, maleic acid, an ester thereof, fumaric acid, an ester thereof, vinyl alcohol, a derivative thereof, an acrylamide derivative and a methacrylamide derivative. Namely, the resist polymer valuably used in the present invention is a polymer formed by substituting a part or all of the proton of the —OH or —COOH group of a polymer as mentioned above by a group represented by the above-mentioned structural formula (1) or (2).

The following compounds are preferable as a photo acid generator valuably used in the present invention:

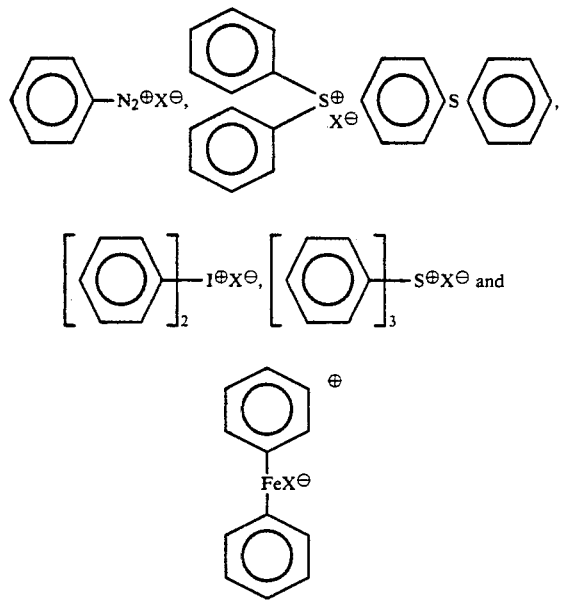

wherein $X^{\ominus}$ represents $PF_6^{\ominus}$, $BF_4^{\ominus}$, $SbF_6^{\ominus}$, $AsF_6^{\ominus}$ or $SbF_5(OH)^{\ominus}$.

Etching for patterning can be accomplished by any of O₂RIE, ECR etching and reactive ion beam etching.

Figure 1A:
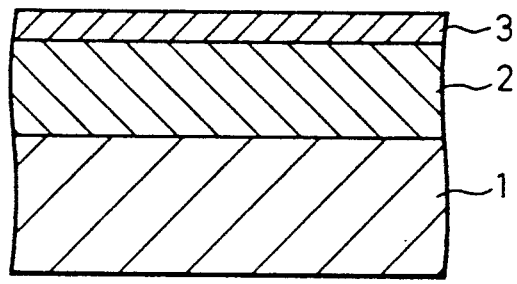
FIG. 1a–c is a diagram illustrating a process of forming a resist pattern by the two-layer resist method.
Figure 1B:
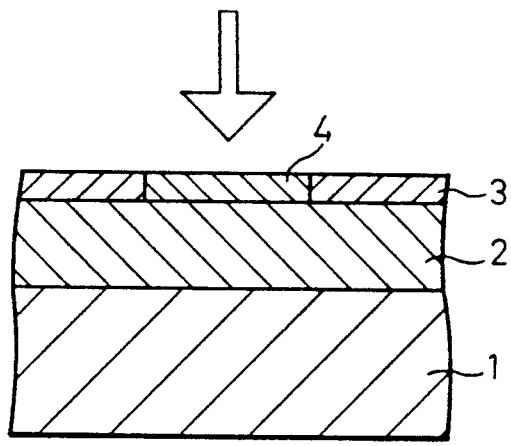
Figure 1C:
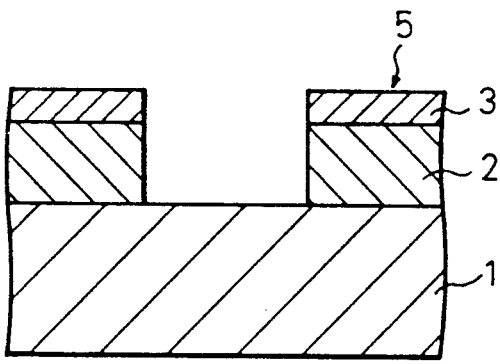

The process for producing a semiconductor device by the two-layer resist method according to the present invention will now be described with reference to FIG. 1 of the accompanying drawings. A planarizing layer 2 is formed on a substrate 1 by customary procedures, and an top layer 3 composed of a resist comprising a substance generating an acid catalyst by being irradiated with radiation and a polymer having an Si-containing group that can be eliminated by the acid catalyst is then formed (see FIG. 1-a). Then, a predetermined area 4 of the top layer 3 is exposed to light, and baking is then carried out according to need (see FIG. 1-b). Then, the top layer 3 is etched by O₂RIE, ECR etching or reactive ion beam etching. Subsequently, the bottom layer 2 is etched to form a positive pattern 5.

The polymer having on the side chain the structure represented by the structural formula (1) or (2), which is used in the present invention, contains Si, and therefore, the polymer has an O₂RIE resistance. In the presence of a protonic acid, the substituent is eliminated from the polymer to form —OH or —COOH. Accordingly, if the material used in the present invention is irradiated with radiations, a protonic acid is generated in the exposed area to cause elimination of the substituent and produce an Si-free polymer. Accordingly, the exposed area is etched by O₂RIE to form a positive pattern, and simultaneously, the bottom layer is also etched with the formed pattern being as the mask, whereby patterning of the top layer and bottom layer is accomplished by one step.

In the process of the present invention, after irradiation with radiations, baking can be carried out according to need. By this baking, the elimination of the Si-containing group is promoted. Preferably, the baking is carried out at a temperature lower than the glass transition temperature of the polymer, or the resolution of the obtained pattern will be degraded.

Figure 2:
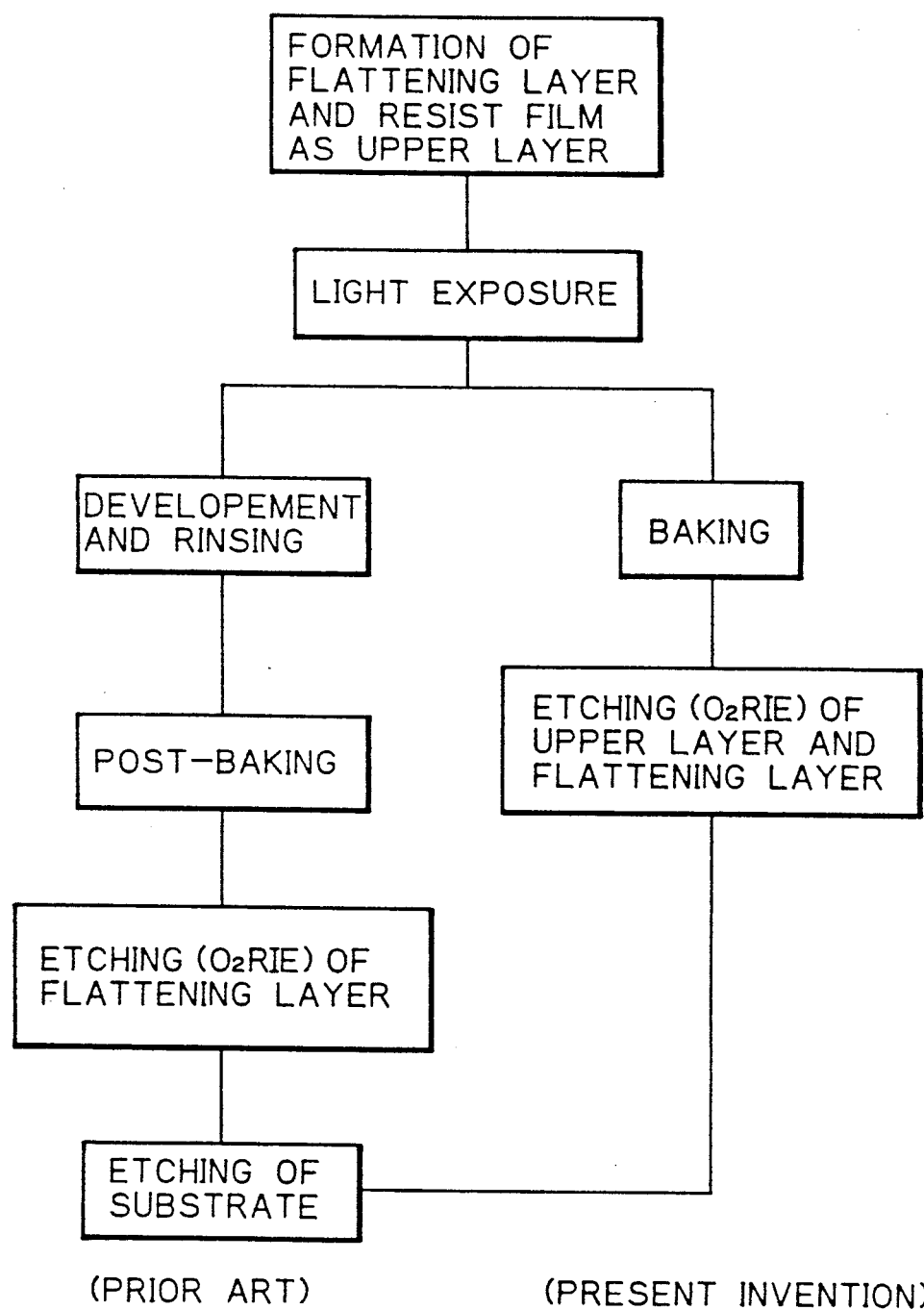
FIG. 2 is a diagram comparing the steps of the present invention with the steps of the conventional process in the formation of patterns according to the two-layer resist method.

FIG. 2 of the accompanying drawings compares the steps of the process of the present invention with the steps of the conventional process. From FIG. 2, it is seen that the process of the present invention is superior to the conventional process.

According to the present invention, the steps of producing a semiconductor device by the two-layer resist method can be simplified, and the throughput and yield greatly increased.

The present invention will now be described in detail with reference to the following examples, that by no means limit the scope of the invention.

EXAMPLE 1 p-Trimethylsiloxy-α-methylstyrene and methyl α-chloromethacrylate were charged at a rate of 9/1 and radical polymerization was carried out at 80° C. in 1,4-dioxane as the solvent to obtain a polymer having a composition ratio of 1/1, a molecular weight of 30,000 and a dispersion degree of 1.8. Then,

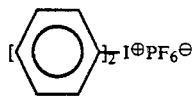

was added to the polymer in an amount of 20% by weight based on the polymer and a 10% by weight solution was prepared, and a film having a thickness of 5000 Å was formed by the spin-coating method and the film was baked at 90° C. for 20 minutes to form a resist film. The resist film was irradiated by an Xe-Hg lamp for 60 seconds, baked at 130° C. for 20 minutes, and developed for 5 minutes by O₂RIE (50 W, 50 SCCM and 0.15 Torr) to obtain a fine pattern at a film residual ratio of 80%.

EXAMPLE 2

Similar results were obtained when the procedures of Example 1 were repeated in the same manner, except that

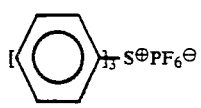

was used instead of

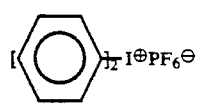

used in Example 1.

EXAMPLE 3

A photoresist comprising a phenolic resin and a photosensitizer (naphthoquinone diazide), OFPR-800 supplied by Tokyo Oka, was coated to a thickness of 1.5 μm and baked at 200° C. for 1 hour, patterning was carried out in the same manner as described in Example 1, and etching was then carried out for 20 minutes by O₂RIE. A line-and-space pattern was transferred without dimensional shift.

EXAMPLE 4

The procedures of Example 1 were repeated in the same manner except that poly(trimethylsilyl methacrylate) was used, and development was carried out for 3 minutes by O₂RIE to obtain a line-and-space pattern at a film residual ratio of 90%.

EXAMPLE 5

Similar results were obtained when the procedures of Example 4 were repeated in the same manner except that poly(trimethylsilylmethyl methacrylate) was used as the polymer.

EXAMPLE 6

When the procedures of Example 1 were repeated in the same manner except that a 1/1 copolymer of α-trimethylsyloxystyrene/methyl methacrylate copolymer was used as the polymer, a 1.0 μm line-and-space pattern was resolved at a film residual ratio of 70%.

EXAMPLE 7

OFPR-800 was coated to a thickness of 1.5 μm and baked at 200° C. for 1 hour to form a planarizing layer and a resists film was formed on the planarizing layer in the same manner as described in Example 1 by using a 1/1 copolymer of m-trimethylsiloxy-α-methylstyrene/-methyl α-chloroacrylate as the upper layer resist. The assembly was irradiated by an Xe-Hg lamp for 100 seconds, baked and etched for 25 minutes by O₂RIE (0.15 Torr, 50 SCCM and 50 W), whereby a line-and-space pattern was transferred.

EXAMPLE 8

Similar results were obtained when the procedures of Example 3 were repeated in the same manner except that ECR (3×10⁻⁴ Torr, 10 SCCM, μ wave power of 1 kW, RF bias of 30 W) was conducted for 10 minutes instead of O₂RIE.

EXAMPLE 9

Similar results were obtained when the procedures of Example 3 were repeated in the same manner except that reactive ion beam etching (1×10⁻⁴ Torr, acceleration voltage of 500 V, 10 SCCM) was carried out for 15 minutes instead of O₂RIE.

In the foregoing examples, the light exposure was effected by Xe-Hg, but obviously patterning can be similarly performed by the light exposure using EB or X-rays.

We claim:

1. A process for the production of a semiconductor device, which comprises forming a film of a resist composed of a substance generating an acid catalyst by being irradiated with radiation and a polymer having an Si-containing group that can be eliminated by the acid catalyst, selectively irradiating the resist film with radiation and patterning the irradiated resist film by one of oxygen reactive ion etching, ECR etching and reactive ion beam etching, wherein the resist comprises a polymer having on the side chain a structure represented by the following structural formula (2):

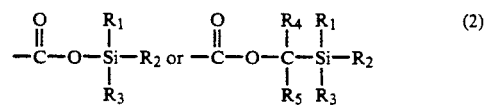

wherein R₁, R₂ and R₃ each represent an alkyl group or a phenyl group, and R₄ and R₅ each represent a hydrogen atom, an alkyl group, a phenyl group or

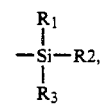

and a substance capable of generating a protonic acid under irradiation with radiations.

2. A process according to claim 1, wherein the substance generating a protonic acid is a member selected from the group consisting of compounds represented by the following formulae:

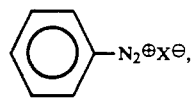

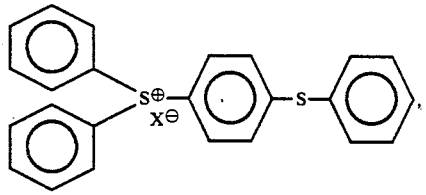

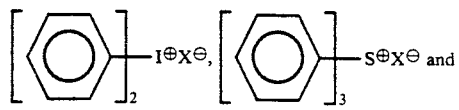

-continued

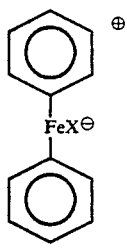

wherein X⊖ represents PF₆⊖, BF₄⊖, SbF₆⊖, AsF₆⊖ or SbF₅(OH)⊖.

3. A process for the production of a semiconductor device according to the two-layer resist method, which comprises forming a planarizing layer composed of an organic material on a substrate, forming a film of a polymer on the planarizing layer and forming a pattern, wherein light exposure is carried out by using a resist composed of a substance generating an acid catalyst by being irradiated with radiation and a polymer having an Si-containing group that can be eliminated by the acid catalyst, as said polymer, and the top layer and the bottom layer are simultaneously patterned by one of oxygen reactive ion etching, ECR etching and reactive ion beam etching, wherein the resist comprises a polymer having on the side chain a structure represented by the following structural formula (2):

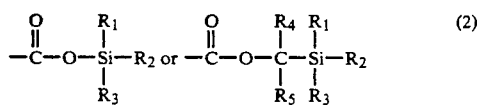 (2)

wherein R₁, R₂ and R₃ each represent an alkyl group or a phenyl group, and R₄ and R₅ each represent a hydrogen atom, an alkyl group, a phenyl group or

and a substance capable of generating a protonic acid under irradiation with radiations.

4. A process according to claim 3, wherein the substance generating a protonic acid is a member selected from the group consisting of compounds represented by the following formulae:

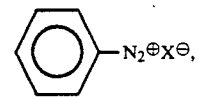

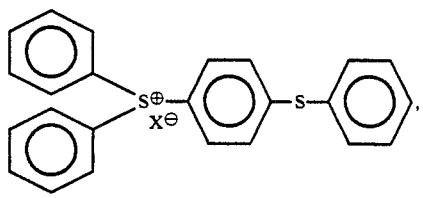

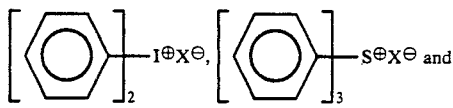

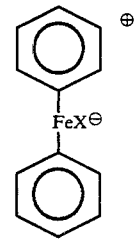

wherein X⊖ represents PF₆⊖, BF₄⊖, SbF₆⊖, AsF₆⊖ or SbF₅(OH)⊖.

* * * * *

UNITED STATES PATENT AND TRADEMARK OFFICE
CERTIFICATE OF CORRECTION

PATENT NO. : 5,068,169

DATED : November 26, 1991

INVENTOR(S) : Takechi et al.

It is certified that error appears in the above-identified patent and that said Letters Patent is hereby corrected as shown below:

Front Page [73], under "Assignee", "Kawqasaki" should be --Kawasaki--.

Signed and Sealed this

Sixteenth Day of March, 1993

Attest:

STEPHEN G. KUNIN

*Attesting Officer*     Acting Commissioner of Patents and Trademarks